(12) United States Patent
Li (10) Patent No.: US 7,417,495 B2
(45) Date of Patent: Aug. 26, 2008

(54) RECONFIGURABLE FREQUENCY FILTER

(75) Inventor: Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 54 days.

(21) Appl. No.: 11/492,983

(22) Filed: Jul. 26, 2006

(65) Prior Publication Data

US 2007/0290737 A1 Dec. 20, 2007

Related U.S. Application Data

(60) Provisional application No. 60/813,375, filed on Jun. 14, 2006.

(51) Int. Cl.
*H03K 5/00* (2006.01)
(52) U.S. Cl. .................. 327/557; 327/552; 327/553
(58) Field of Classification Search ......... 327/551–559, 327/103
See application file for complete search history.

(56) References Cited

U.S. PATENT DOCUMENTS

| | | | |
|---|---|---|---|
| 5,621,340 A | 4/1997 | Lee et al. | |
| 6,304,134 B1 * | 10/2001 | Pavan | 327/552 |
| 6,480,064 B1 * | 11/2002 | Cyrusian | 330/253 |
| 6,677,822 B2 * | 1/2004 | Hasegawa | 327/552 |
| 6,958,652 B2 * | 10/2005 | Kim et al. | 330/254 |
| 7,061,309 B2 * | 6/2006 | Kato et al. | 327/553 |
| 2003/0006834 A1 | 1/2003 | Morie et al. | |
| 2005/0162230 A1 | 7/2005 | Tran et al. | |

OTHER PUBLICATIONS

Extended European Search Report to European Application No. 07004090.2-1233 completed on Jan. 10, 2008, 5 pages.
Partial European Search Report to European Application No. 07004090.2-1233 completed on Oct. 10, 2007, 5 pages.

* cited by examiner

*Primary Examiner*—Dinh T. Le
(74) *Attorney, Agent, or Firm*—Sterne Kessler Goldstein Fox PLLC (57) ABSTRACT

There are various mobile communication standards such as GSM, EDGE, and W-CDMA. For a GSM or EDGE system, a receiver must be configured to work with an IF signal with a center frequency and bandwidth of 200 KHz. For WCDMA system, the same receiver must be configured to work with an IF signal with a center frequency of 600 KHz to 1000 KHz and band width of 2000 KHz. Accordingly, a configurable frequency IF filter with the capability to operate with multiple standards is provided.

18 Claims, 9 Drawing Sheets

FIG. 4
(Conventional)

RECONFIGURABLE FREQUENCY FILTER

CROSS REFERENCE TO RELATED APPLICATIONS

This application claims the benefit of U.S. Provisional Application No. 60/813,375 filed Jun. 14, 2006, which is incorporated herein by reference in its entirety.

FIELD OF THE INVENTION

The present invention relates to a reconfigurable/programmable intermediate frequency (IF) filter.

BACKGROUND OF THE INVENTION

Figure 1:
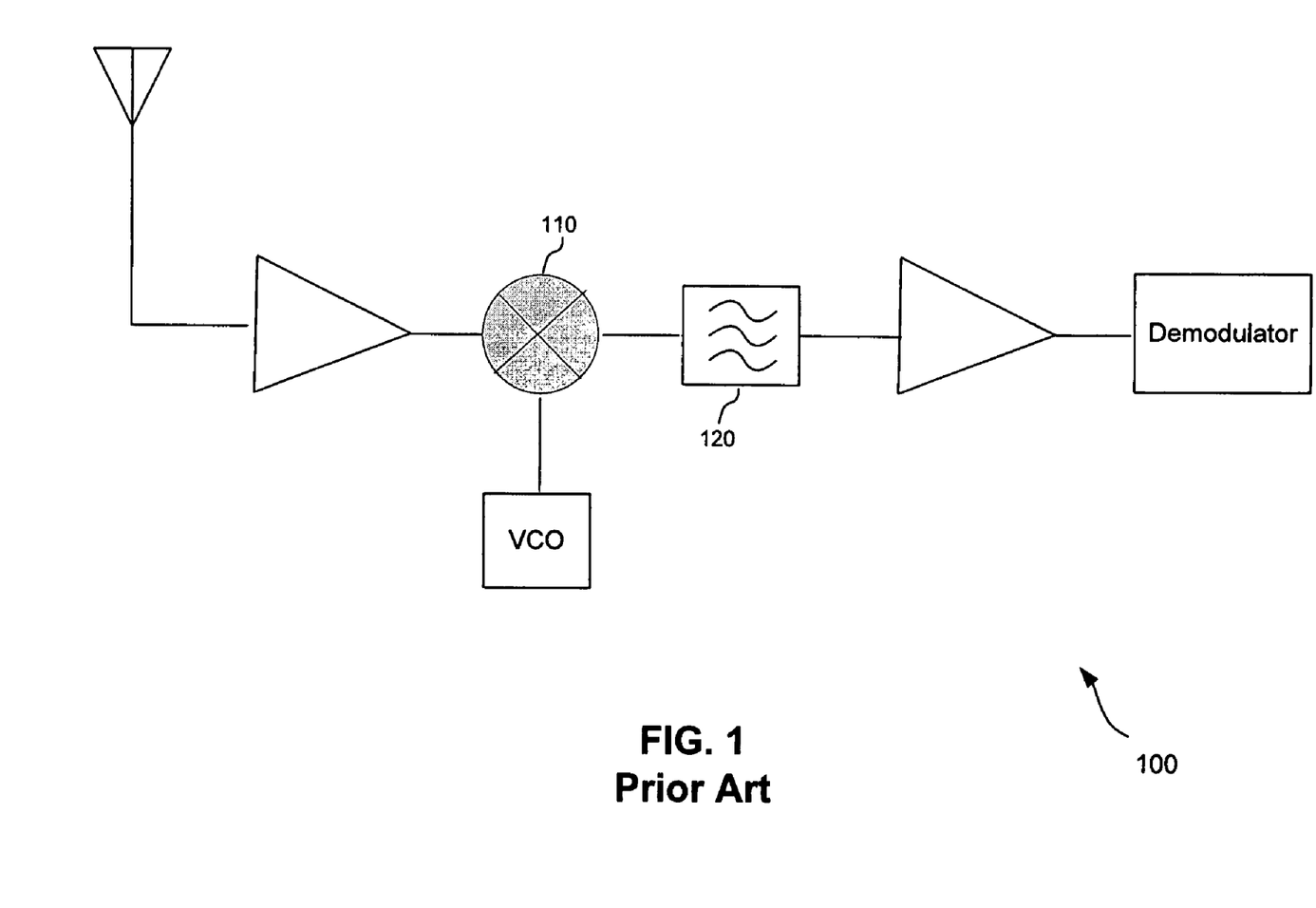
FIG. 1 illustrates a block circuit diagram of a conventional receiver.

Today many radio frequency (RF) receivers are super heterodyne receivers. FIG. 1 illustrates a RF receiver 100 that employs the heterodyne principle to down-convert and demodulate data from a RF signal. Generally, data are transmitted on a high frequency signal because of the intrinsic relationship between the RF's wavelength and the size of an antenna. The high frequency signal used to piggy back an information signal of lower frequency is called a carrier signal.

In an heterodyne system, a carrier signal is removed from a transmitted RF signal by mixing the received signal with another locally generated signal. The mixing process yields several signals at various frequency bands. The frequency band of interests is the intermediated frequency (IF) of the system, which contains data signals in modulated form. As illustrated in FIG. 1, RF signals received by an antenna are amplified and outputted to a mixer 110. The output of mixer 110 is inputted into an IF filter 120. IF filter 120 performs several important functions such as image rejection, amplification, and bandpass filtration. Depending upon the application, IF filter 120 may be a Bessel filter or more commonly a Butterworth filter. The latter is designed to provide a maximum frequency plateau of minimum ripple across the bandpass frequency of the filter. The former is designed to perform in the substantially the same way but with a time delay.

Currently there are several co-existing communication standards such as: global system for mobile communication (GSM), a second generation (2G) technology; universal mobile telecommunications system (UMTS), a third generation technology (3G) (UMTS is also known as wideband code division multiple access (W-CDMA)); enhanced data GSM environment (EDGE); and CDMA2000. Each standard typically operates at a different IF frequency and has a different bandwidth. Thus, each standard requires a different IF filter configuration.

Figure 2:
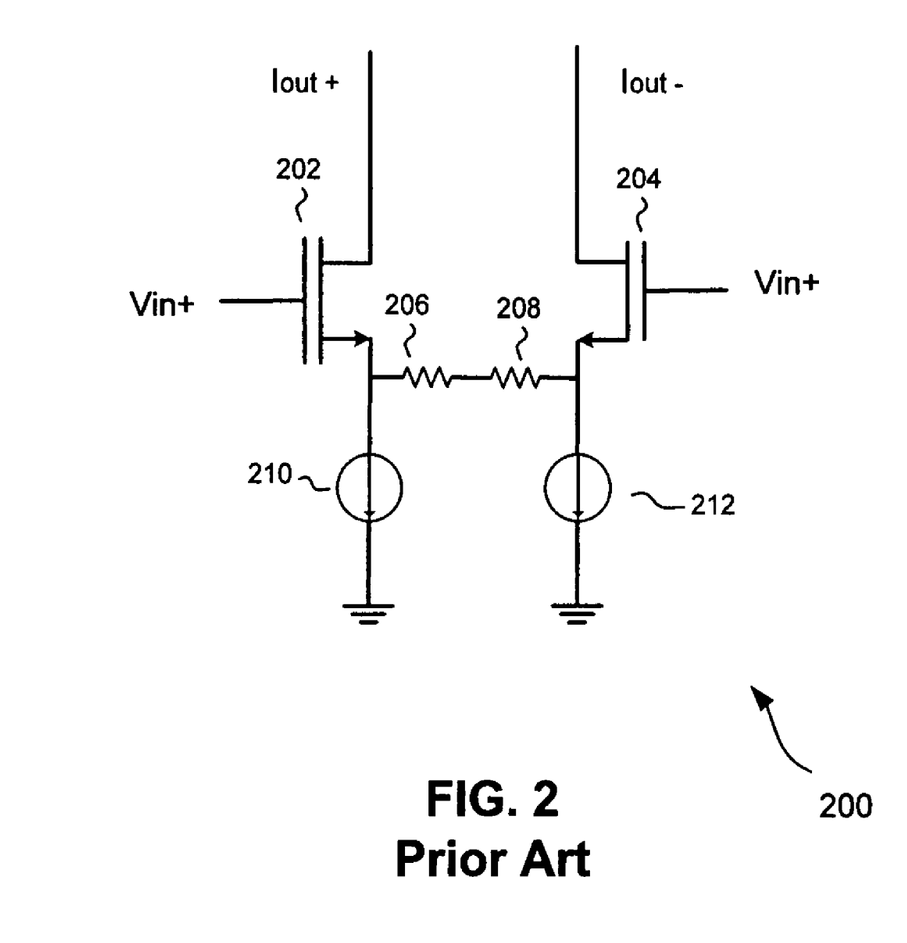
FIG. 2 illustrates a circuit diagram of a conventional transconductor.

One class of filters with a high frequency response is the transconductor capacitor ($G_mC$) filter. FIG. 2 illustrates a conventional transconductor circuit 200 used to implement a $G_mC$ filter. Circuit 200 includes a pair of transistors 202 and 204, a pair of resistors 206 and 208, and a pair of current sources 210 and 212. The differential input voltages are received by the gates of transistors 202 and 204. In operation, transistor 202 outputs a current ($I_{out}$) when it is biased by a differential voltage ($V_{in+}$). The ratio of the output current and input voltage defines the transconductance ($G_m$) of transistor 202. Thus, the $G_m$ of circuit 200 is:

$$G_m = \frac{\partial I_{out}}{\partial V_{in}}$$

To increase the linearity of circuit 200, degenerative resistors 206 and 208 are coupled between the sources of transistors 202 and 204. Further, each source of transistors 202 and 204 is independently biased by current source 210 and 212. In this configuration, DC current flow through resistors 206 and 208 is not present and only AC current flow is allowed. This yields a transconductor with a better performance due to the elimination of voltage drop across the degenerative resistors.

As mentioned, each communication standard operates at a different IF frequency and bandwidth. Hence a receiver is typically designed to work optimally with a certain communication standard. For example, a GSM or EDGE compatible receiver must be configured to work with an IF signal with a center frequency of 200 KHz. For WCDMA, the same receiver must be configured to work with an IF signal with a center frequency of 600 KHz to 1000 KHz. Hence, in current receiver systems, a specific set of filters is designed and manufactured for each communication standard.

Accordingly, what is needed is a filter stage that can be implemented across various communication standards.

BRIEF DESCRIPTION OF THE DRAWINGS/FIGURES

The present invention is described with reference to the accompanying drawings.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described. An embodiment of the present invention is now described. While specific methods and configurations are discussed, it should be understood that this is done for illustration purposes only. A person skilled in the art will recognize that other configurations and procedures may be used without departing from the spirit and scope of the invention.

Figure 3:
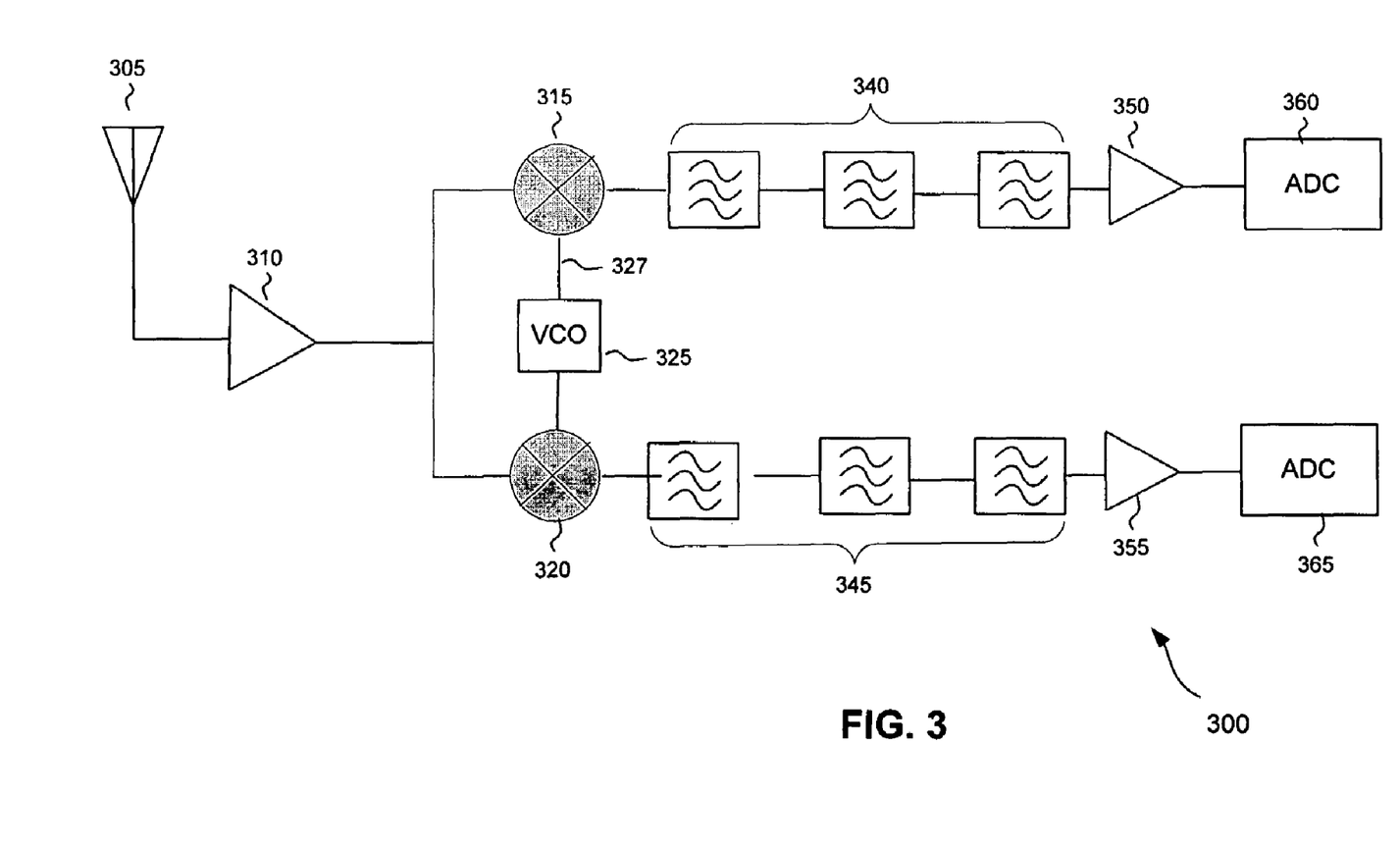
FIG. 3 illustrates a block circuit diagram of a transceiver according to an embodiment of the present invention.

FIG. 3 illustrates a wireless receiver 300, according to an embodiment of the present invention, that includes an antenna 305, a low noise amplifier (LNA) 310, mixers 315 and 320, a local oscillator 325, filter stages 340 and 345, amplifiers 350 and 355, and a pair of analog to digital converters (ADC) 360 and 365.

RF signals received by antenna 305 are forwarded to LNA 310. The received RF signals are single-ended RF signals. Depending upon the communication standard used, the received RF signals typically range from 800 MHz to 2.1 GHz. For example, a GSM network may be implemented at 800 MHz or 1.9 GHz. W-CDMA is typically implemented at 2.1 GHz.

In receiver 300, LNA 310 amplifies RF signals and provide a low noise amplification. The amplified signals are then converted into a in-phase (I) signal portion and a quadrature (Q) signal portion by mixers 315 and 320, respectively. Mixers 315 and 320 also down converts each of the I and Q signals to a lower frequency signal. Both mixers 315 and 320 operate in the substantial same way, as such only the operation of mixer 315 will be described. Mixer 315 mixes the I signal (or Q) with a local signal 327 that is generated by a voltage control oscillator (VCO) 325. The frequency of signal 327 is generally selected to match with the frequency of the carrier signal of the received RF signal. In this way, the input I signal or (Q signal) is down converted to an intermediate frequency signal by mixer 315. For a GSM or EDGE system, the IF signal has a center frequency of 200 KHz and a frequency bandwidth of 200 KHz. For a W-CDMA system, the IF signal has a center frequency of 1 MHz and a frequency bandwidth of 1.8 MHz.

Although not necessarily required, the IF signal may be amplified by an IF amplifier (not shown). After amplification, the IF signal is feed through filter stage 340. Filter stage 340 comprises several stages of filters and variable gain amplifiers. Filter stage 340 also performs DC offset rejection, signal amplification, and bandpass filtration. In this way, the IF signal may be processed to obtain the proper gain and frequency bandwidth. For example, filter stage 340 comprises multiple stages of Butterworth filters. Alternatively, filter stage 340 comprises multiple stages of Chebyshev or Bessel filters. A combination of Butterworth, Chebyshev or Bessel filters may also be used. Filter stage 345 is implemented in the same way as filter stage 340.

As shown in FIG. 3, the output of filter stage 340 or 345 may further be amplified using amplifier 350 and 355. This amplification stage is optional and generally depends on the application. After the final amplification stage, the amplified signal is routed to an analog to digital converter (ADC) 360/365.

Figure 4:
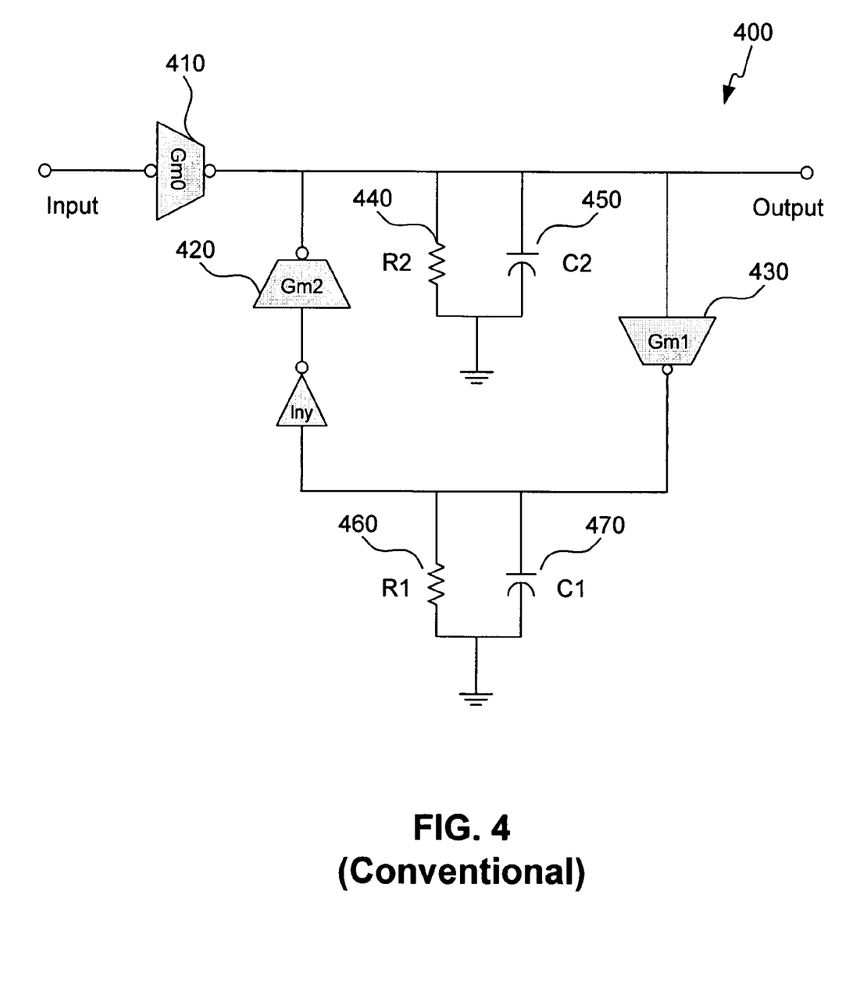
FIG. 4 illustrates a circuit diagram of a $G_m$-C bandpass filter.

Conventionally, receiver 300 is implemented using a conventional transconductor capacitor ($G_mC$) bandpass (BP) filter 400, such as the one shown in FIG. 4. Filter 400 will be further discussed below. In an embodiment, receiver 300 is implemented using a reconfigurable $G_mC$ bandpass filter 500, such as the one shown in FIG. 5. $G_mC$ bandpass filter 500 will be further discussed below.

As shown in FIG. 4, $G_mC$ bandpass filter 400 includes three $G_m$ stages 410, 420, and 430, a resistor 440, a capacitor 450, a second resistor 460, and a second capacitor 470. Resistor 440 and capacitor 450 provide a first resistor-capacitor pair that generally determines the bandwidth frequency of filter 400. Resistor 460 and capacitor 470 provide a second resistor-capacitor pair that determines the center frequency of filter 400. For example, to adjust the bandwidth of filter 400, the RC constant of the resistor 440-capacitor 450 pair may be adjusted. To adjust the center frequency, the RC constant of the resistor 460-capacitor 470 pair may be adjusted. Further, $G_m$ stage 410 is used to primarily control the overall signal gain of filter 400. $G_m$ stages 420 and 430 are used to primarily control the overall frequency response of filter 400.

Figure 5:
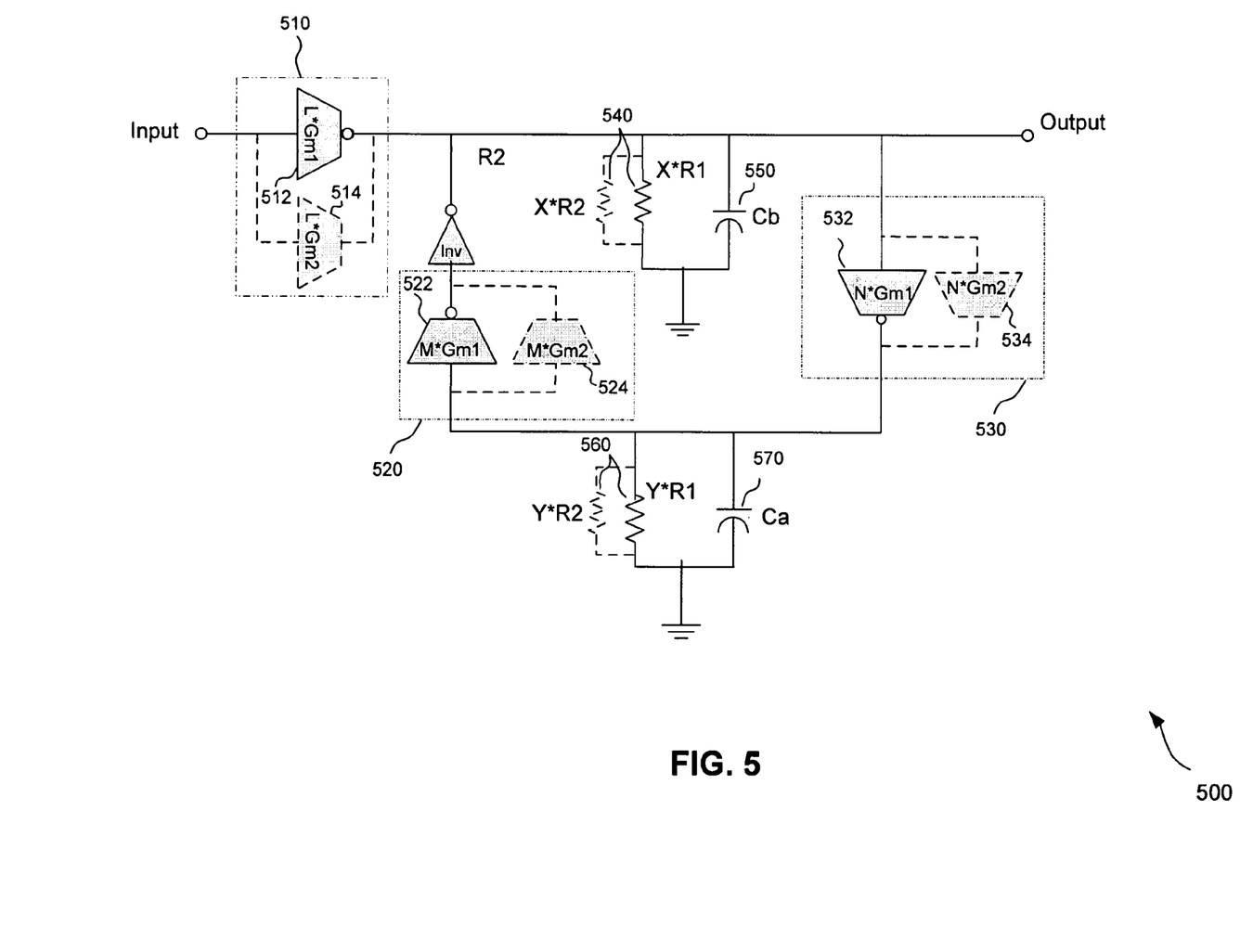
FIG. 5 illustrates a circuit diagram of a $G_m$-C bandpass filter according to an embodiment of the present invention.
Figure 7:
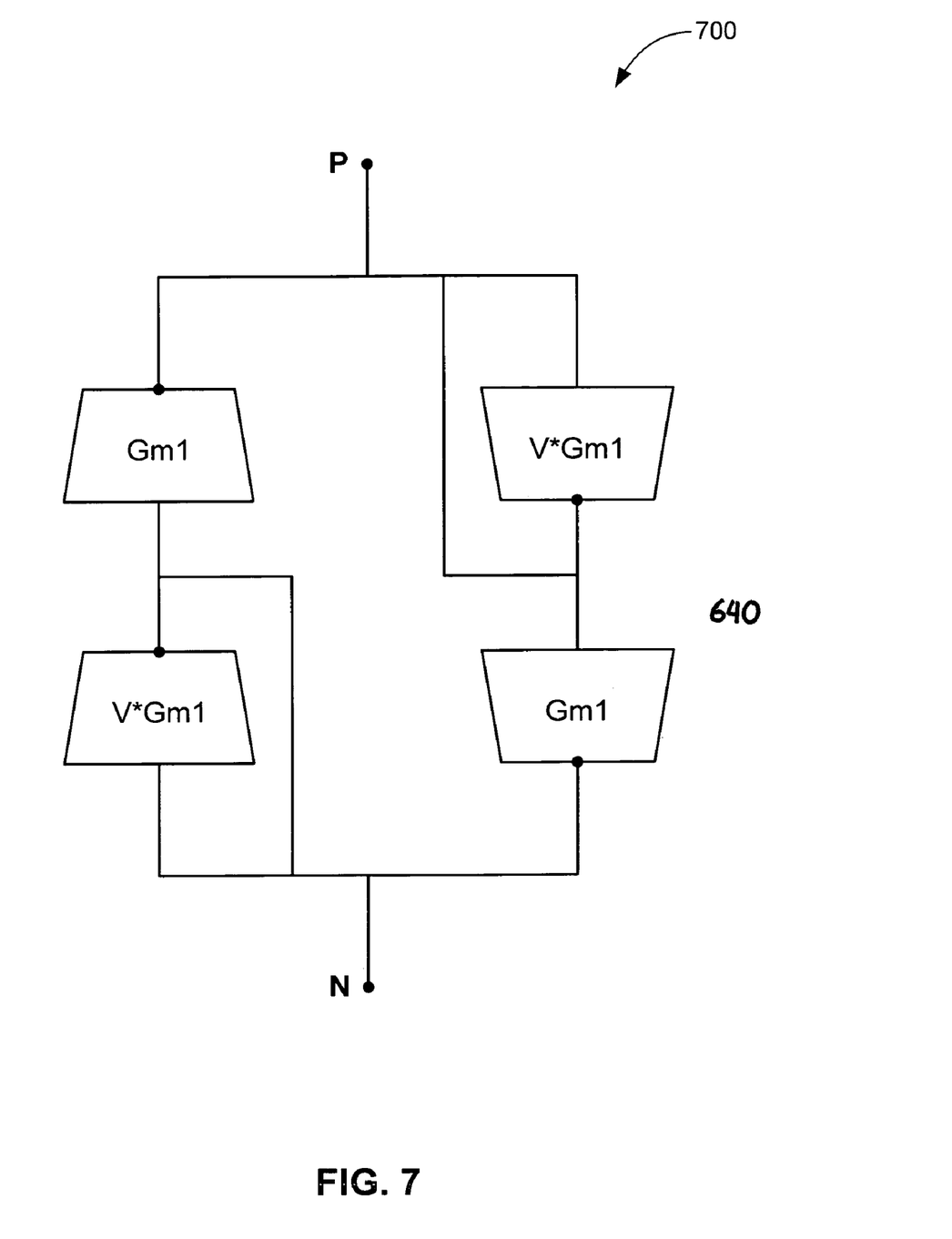
FIG. 7 illustrates a circuit diagram of an adjustable resistance $G_m$ stage.

As shown in FIG. 5, reconfigurable $G_mC$ bandpass filter 500 includes three programmable $G_m$ stages 510, 520, and 530, a resistor 540, a capacitor 550, a second resistor 560, and a second capacitor 570. In an embodiment, capacitors 550 and 570 are adjustable capacitors. These adjustable capacitors serve to compensate for the system processing corners or variations. Adjustable capacitors are well known in the art. Further, resistors 540 and 560 may also be adjustable and may be implemented as a variable $G_m$ stage as shown in FIG. 7, which will be further discussed below.

In an embodiment, $G_m$ stages 510, 520, and 530 are programmable or reconfigurable in order to increase the overall $G_m$ of the system. In this manner, the frequency response of the filter may be manipulated. As mentioned, the frequency response of a filter may be affected by changing the time constant of the filter, the RC value. The general relationship between RC, $G_m$ and frequency is:

$$\text{frequency} \propto \frac{1}{RC} = \frac{G_m}{C}$$

Thus, to affect the frequency response of a filter, one may manipulate the capacitance or the $G_m$ value of the circuit. Filter 500 is a multi-standard filter because its $G_m$ may be adjusted such that the frequency response of filter 500 is dramatically changed. Again, the IF center frequency of a GSM system is approximately 200 KHz and approximately 1000 KHz for a W-CDMA system. Filter 500 can operate in either environment by increasing or lowering the $G_m$ value of $G_m$ stages 510, 520, and 530. For W-CDMA application, the $G_m$ of the $G_m$ stages 510, 520, and 530 has to be increased relative to where the $G_m$ value is set at for GSM application.

Each of the $G_m$ modules or stages includes two $G_m$ circuits connected in parallel. $G_m$ stage 510 includes $G_m$ circuits 512 and 514. $G_m$ stage 520 includes $G_m$ circuits 522 and 524. $G_m$ stage 530 includes $G_m$ circuits 532 and 534. Each of the $G_m$ circuits 514, 524, and 534 has a larger $G_m$ value than its respective parallel $G_m$ stage. In an embodiment, the $G_m$ of circuit 514 is 10 times greater than $G_m$ of circuit 512. Similarly, the $G_m$ of circuits 524 and 534 is 10 times greater the $G_m$ of circuits 522 and 532, respectively. Even though the each of the $G_m$ of circuits 514, 524, and 534 is 10 times greater than the Gm of the respective parallel circuit, other multiples could also be employed such as 15×, 20×, etc.

In GSM mode, $G_m$ circuits 512, 522, and 532 are enabled and $G_m$ circuits 514, 524, and 534 are disabled to provide the necessary gain and IF characteristics for GSM operation. In this manner, only one of the $G_m$ circuit of the parallel circuit pair (e.g. $G_m$ stage 510 or 520) is enabled at any time. In W-CDMA mode, $G_m$ circuits 512, 522, and 532 are disabled and $G_m$ circuits 514, 524, and 534 are enabled to provide the necessary gain and IF characteristics for W-CDMA operation. In this manner, filter 500 exhibits a larger overall $G_m$ and yields a larger IF frequency (compared to GSM) as required W-CDMA. Alternatively, both circuits of the parallel circuit pair could be enabled at the same time. However, the $G_m$ ratio of the circuit pair would have to be manipulated such that the parallel $G_m$ circuit pair would yield a desired $G_m$ value. For example, $G_m$ stage 510 may be configured such that both $G_m$ circuits 512 and 514 are enabled in GSM mode, and 1 of the $G_m$ circuits 512 and 514 is disabled in W-CDMA mode.

The $G_m$ of a $G_m$ circuits may be controlled with many methods. One of the methods is to manipulate the transistor's channel width and length ratio. For a transistor, the relationship between $G_m$, channel length, and width is:

$$G_m \propto \left(\frac{\text{Width}}{\text{Length}}\right)$$

In filter 500, the surface area of $G_m$ circuits 512 and 514 are generally the same. The major difference is in the W/L ratio of transistors in each of the circuits. For example, the W/L ratio for circuit 512 may be $2\mu/6.3\mu \approx 0.317$. For circuit 514, the W/L ratio is reversed, $6.3\mu/2\mu \approx 3.150$.

Figure 6A:
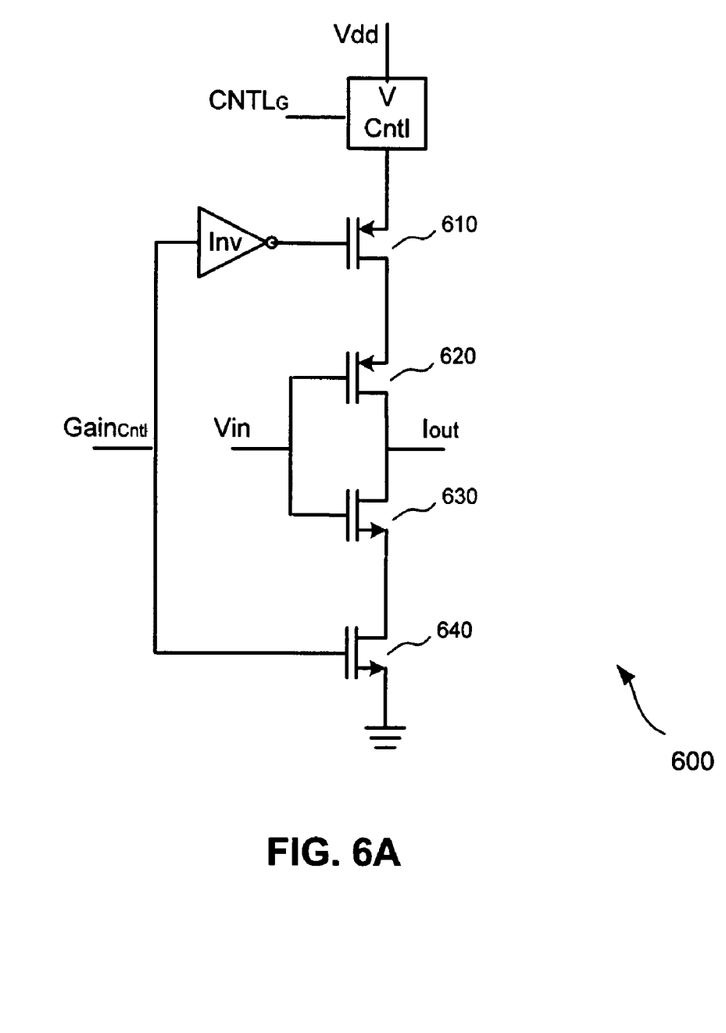
FIG. 6A illustrates a circuit diagram of a switchable Gm cell implemented in the circuit of FIG. 5.

FIG. 6A illustrates a $G_m$ cell 600, which is one example embodiment that can be used to implement the $G_m$ circuit of $G_m$ stages 510, 520, and 530. $G_m$ cell 600 includes two positive channel metal oxide semiconductors (PMOS) 610 and 620 and two negative channel MOS (NMOS) 630 and 640. The gates of PMOS 620 and NMOS 630 are coupled to a voltage input. The drains of PMOS 620 and NMOS 630 are coupled together and comprise the output node in which $I_{out}$ is obtained. The source of PMOS 610 is coupled to a voltage controller. The drain of PMOS 610 is coupled to the source of PMOS 620. The source of NMOS 640 is coupled to ground and the drain is coupled to the source of NMOS 630. Both the gates of PMOS 610 and NMOS 640 are coupled together and to a gain controller. Further an inverter is coupled to the gate of PMOS 610.

Figure 6B:
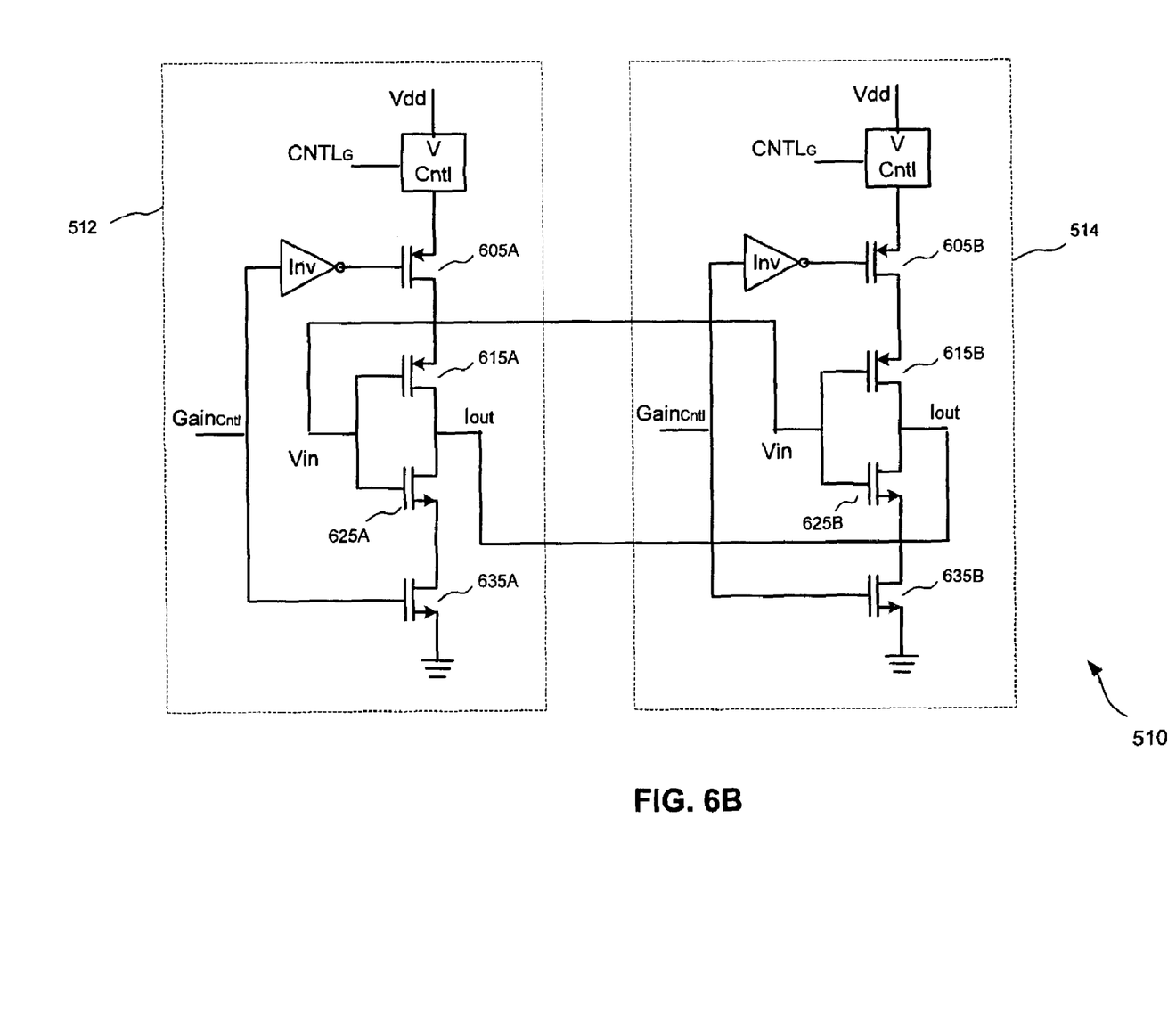
FIG. 6B illustrates a circuit diagram of two parallel Gm cells implemented in the circuit of FIG. 5.

FIG. 6B illustrates an example implementation of $G_m$ stage 510. As shown, $G_m$ stage 510 includes $G_m$ circuits 512 and 514 connected in parallel. The input nodes of circuits 512 and 514 are commonly coupled to an input source (not shown). Similarly, the output nodes of circuits 512 and 514 are commonly coupled to an output node. Transistors 605A-B, 615A-B, 625A-B, and 635A-B are similar to transistors 610, 620, 630, and 640 of $G_m$ cell 600. In the preferred embodiment, while in GSM mode, the cell with a smaller $G_m$ value is enabled and the cell with the larger $G_m$ value is disabled. In W-CDMA mode, the cell with the larger $G_m$ value is enabled and the cell with the smaller $G_m$ value is disabled. To disable cell 600, PMOS 610 and NMOS 640 are both disabled. In this way, the physical connection is maintained but $G_m$ contribution of the cell is eliminated. As mentioned, $G_m$ stage 510 may be configured such that both cells are enabled for GSM mode and only 1 of the cell is enabled for W-CDMA mode or vice versa. Such configuration may be readily performed by one skilled in the art.

FIG. 7 illustrates a $G_m$ stage 700, which is one example embodiment that can be used to implement adjustable resistors 540 and 560. $G_m$ stage 700 includes 4 GM cells arranged as shown such that the total resistance is:

$$R = \frac{2}{V * G_{m1} - G_{m1}}$$

When $G_m$ stage 700 is being implemented as resistor 540, the change in $G_m$ affects the bandwidth of $G_mC$ filter 500. When $G_m$ stage 700 is being implemented as resistor 560, the change in $G_m$ affects the center frequency of $G_mC$ filter 500. As such, $G_m$ stage 700 may be regulated to obtain a desired bandwidth and center frequency. Gm can be regulated the same way as illustrated in FIG. 6A and FIG. 6B.

Figure 8:
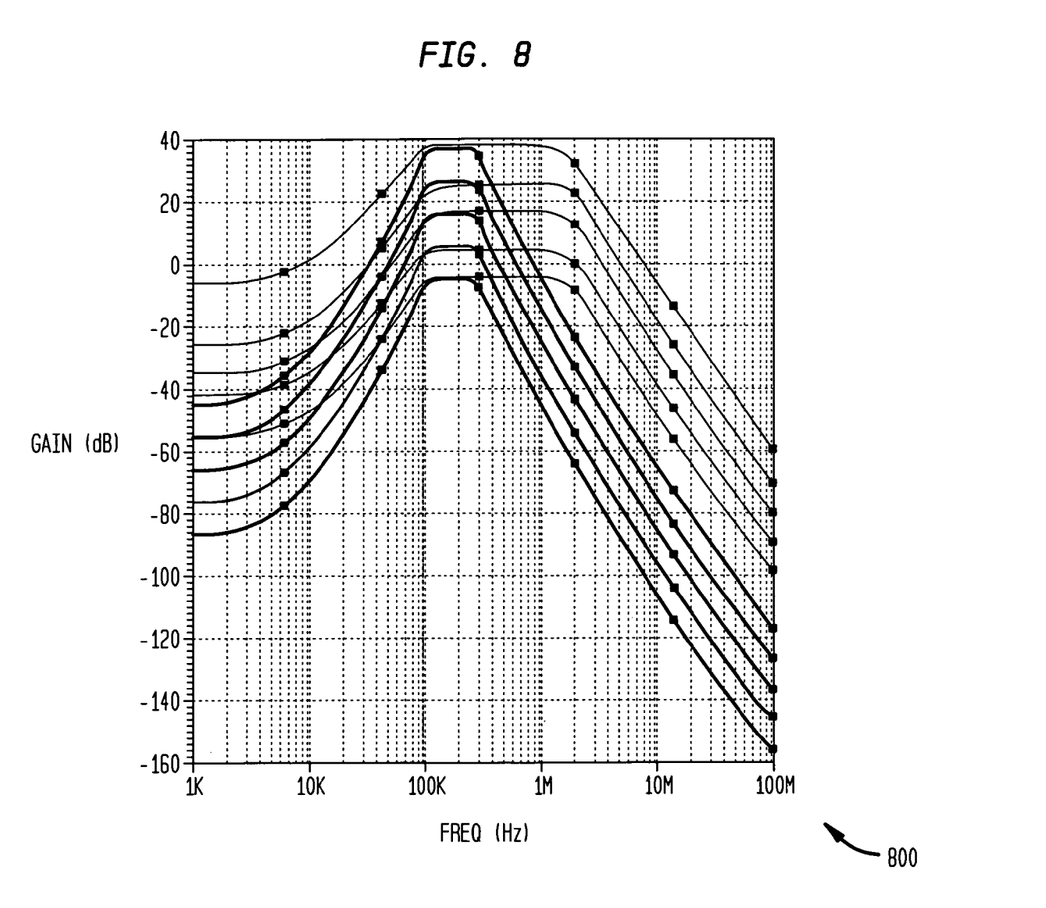
FIG. 8 illustrates a Gain (dB) vs. frequency chart for the filter of FIG. 5 under various operating modes.

FIG. 8 illustrates a frequency vs. dB chart for GmC filter 500. As shown, the frequency bandwidth of W-CDMA mode is approximately 10 times the bandwidth of GSM mode.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

I claim:

1. A switchable tranconductance ($G_m$) circuit module comprising:
a first $G_m$ circuit coupled between an output node and an input node; and
a second $G_m$ circuit coupled in parallel to the first $G_m$ circuit, each $G_m$ circuit comprising:
a first and second positive channel metal oxide semiconductors (PMOS), a drain of the first PMOS coupled to a source of the second PMOS;
a first and second negative channel metal oxide semiconductors (NMOS), a drain of the first NMOS is coupled to a source of the second NMOS, a drain of the second NMOS is coupled to a drain of the second PMOS,
wherein a $G_m$ value across the output and input nodes is adjustable by selectively switching one or both of the $G_m$ circuits,
wherein each $G_m$ circuit is switched off by deactivating the first PMOS and the first NMOS.

2. The $G_m$ circuit module of claim 1, wherein a first $G_m$ value of the first $G_m$ circuit is less than a second $G_m$ value of the second $G_m$ circuit.

3. The $G_m$ circuit module of claim 1, wherein the second $G_m$ value is more than 9 times greater than the first $G_m$ value.

4. The $G_m$ circuit module of claim 1, wherein only one of the $G_m$ circuits is switched active at a time.

5. The $G_m$ circuit module of claim 1, wherein the first $G_m$ value of the first $G_m$ circuit and the second $G_m$ value of the second $G_m$ circuit is controlled by manipulating a ratio of width to length of the PMOS and NMOS semiconductors that comprise each $G_m$ circuit.

6. A radio frequency (RF) filter comprising:
a first transconductance ($G_m$) circuit having an input port coupled to a first node and an output port coupled to a second node;
a second $G_m$ circuit coupled in parallel to the first $G_m$ circuit;
a third $G_m$ circuit having an output port coupled to the second node and an input port coupled to a third node;
a fourth $G_m$ circuit coupled in parallel to the third $G_m$ circuit;
a fifth $G_m$ circuit having an output port coupled to the third node and an input port coupled to the second node;

a sixth $G_m$ circuit coupled in parallel to the fifth $G_m$ circuit, wherein the RF filter's frequency characteristic is adjustable by selectively switching any or all of the $G_m$ circuits, wherein each $G_m$ circuit is switched off by deactivating the first PMOS and the first NMOS.

7. The RF filter of claim 6, wherein the first $G_m$ circuit has a smaller $G_m$ value than a $G_m$ value of the second $G_m$ circuit, the third $G_m$ circuit has a smaller $G_m$ value than a $G_m$ value of the fourth $G_m$ circuit, and the fifth $G_m$ circuit has a smaller $G_m$ value than a $G_m$ value of the sixth $G_m$ circuit.

8. The RF filter of claim 6, wherein the second $G_m$ value is more than 9 times greater than the first $G_m$ value.

9. The RF filter of claim 6, wherein the first, third, and fifth $G_m$ circuits are switched on, the second, fourth and sixth $G_m$ circuits are switched off.

10. The RF filter of claim 6, wherein each of the $G_m$ circuits is selectively switched active or inactive as to enable the RF filter to output an intermediate frequency according to a communication standard.

11. The RF filter of claim 10, wherein the communication standard is a global system for mobile communication (GSM) standard.

12. The RF filter of claim 10, wherein the communication standard is wideband code division multiple access (W-CDMA).

13. The RF filter of claim 6, wherein each $G_m$ circuit comprises:
   a first and second positive channel metal oxide semiconductors (PMOS), a drain of the first PMOS coupled to a source of the second PMOS;
   a first and second negative channel metal oxide semiconductors (NMOS), a drain of the first NMOS is coupled to a source of the second NMOS, a drain of the second NMOS is coupled to a drain of the second PMOS.

14. The RF filter of claim 6, wherein the $G_m$ value of any $G_m$ circuit is controlled by manipulating a ratio of width to length of the PMOS and NMOS semiconductors which comprise the $G_m$ circuits.

15. The RF filter of claim 6, further comprising:
   a variable resistor to modify one or both of a bandwidth and a center frequency.

16. A radio frequency (RF) filter comprising:
   a first adjustable transconductance ($G_m$) module having an input port coupled to a first node and an output port coupled to a second node;
   a second adjustable $G_m$ module having an output port coupled to the second node and an input port coupled to a third node;
   a third adjustable $G_m$ module having an output port coupled to the third node and an input port coupled to the second node;
   wherein the RF filter outputs an intermediate frequency according to a first or a second communication standard by adjusting a $G_m$ value of one of the adjustable $G_m$ modules;
   each of the $G_m$ modules further comprising:
   at least a first and second $G_m$ circuit coupled in parallel, each of the $G_m$ circuit including:
   a first and second positive channel metal oxide semiconductors (PMOS), a drain of the first PMOS coupled to a source of the second PMOS;
   a first and second negative channel metal oxide semiconductors (NMOS), a drain of the first NMOS is coupled to a source of the second NMOS, a drain of the second NMOS is coupled to a drain of the second PMOS,
   and wherein each $G_m$ circuit is switched off by deactivating the first PMOS and the first NMOS.

17. The RF filter of claim 16, wherein the $G_m$ value of any $G_m$ circuit is controlled by manipulating a ratio of width to length of the PMOS and NMOS semiconductors which comprise the $G_m$ circuits.

18. The RF filter of claim 16, further comprising:
   a variable resistor to modify one or both of a bandwidth and a center frequency.

* * * * *